(12) United States Patent
Abbott

(10) Patent No.: US 8,574,931 B2
(45) Date of Patent: Nov. 5, 2013

(54) SINGULATION AND STRIP TESTING OF NO-LEAD INTEGRATED CIRCUIT PACKAGES WITHOUT TAPE FRAME

(75) Inventor: Donald C Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 203 days.

(21) Appl. No.: 13/078,092

(22) Filed: Apr. 1, 2011

(65) Prior Publication Data

US 2012/0252142 A1    Oct. 4, 2012

(51) Int. Cl.
*H01L 21/66* (2006.01)
*H01L 21/56* (2006.01)

(52) U.S. Cl.
USPC ...... 438/15; 438/123; 438/127; 257/E21.521; 257/E21.502

(58) Field of Classification Search
USPC .......................................... 438/15, 123, 127
See application file for complete search history.

(56) References Cited

U.S. PATENT DOCUMENTS

2004/0121514 A1*  6/2004  Yoo et al. ............... 438/106
2006/0199308 A1*  9/2006  Lee et al. ............... 438/110

\* cited by examiner

*Primary Examiner* — Alexander Ghyka
(74) *Attorney, Agent, or Firm* — Steven A. Shaw; W. James Brady; Frederick J. Telecky, Jr.

(57) ABSTRACT

Strip testing is applied to a plurality of integrated circuit dies that are each encapsulated in an encapsulant, that each have a set of externally accessible leads connected thereto, and that are electrically isolated from one another. Provision is made for the strip testing to be performed without mounting the encapsulated integrated circuit dies on a support tape.

13 Claims, 3 Drawing Sheets

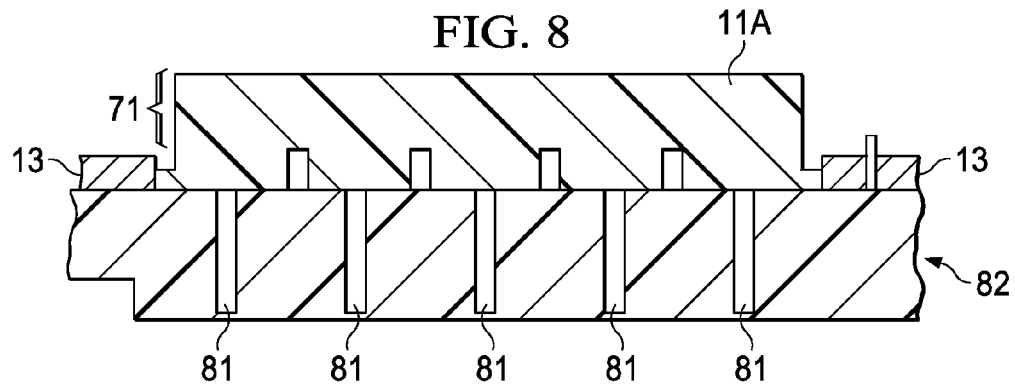
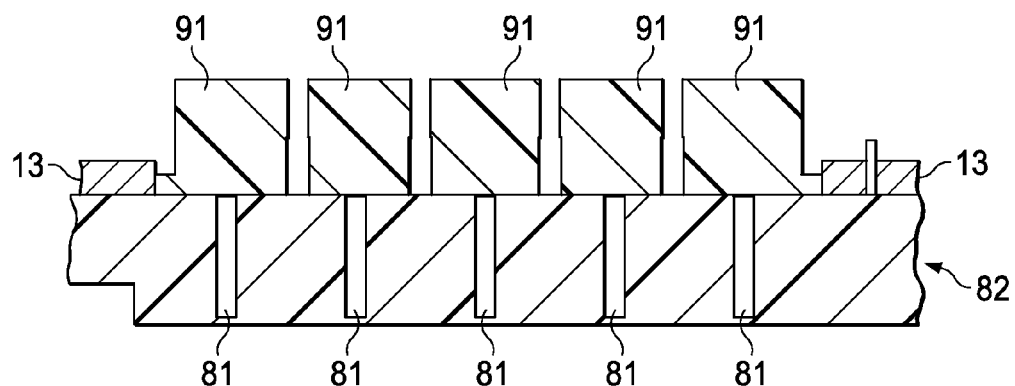
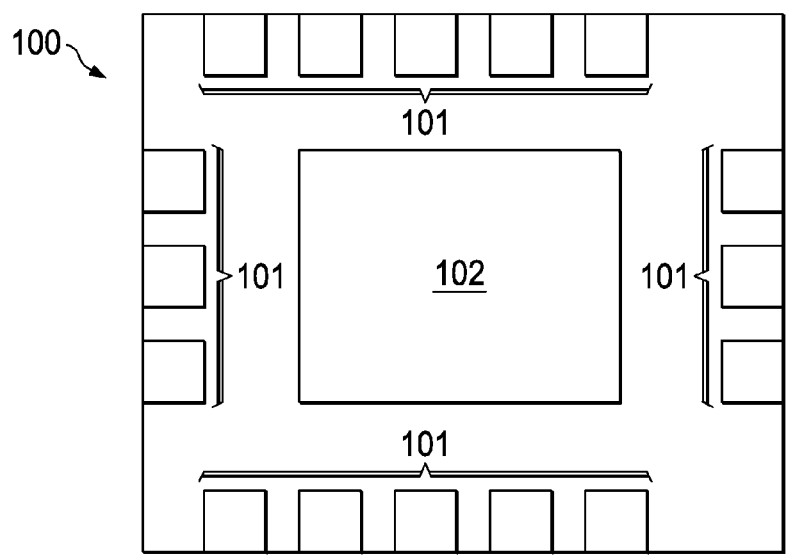

SINGULATION AND STRIP TESTING OF NO-LEAD INTEGRATED CIRCUIT PACKAGES WITHOUT TAPE FRAME

This application claims priority to U.S. Provisional Application No. 61/227,269 filed Jul. 21, 2009.

FIELD OF THE INVENTION

The invention relates generally to no-lead integrated circuit (IC) packages and, more particularly, to singulation and strip testing of no-lead integrated circuit packages.

BACKGROUND OF THE INVENTION

After packaging no-lead integrated circuits, for example QFN (Quad Flat No lead) and SON (Small Outline No Lead) type packages, conventional strip testing is advantageously employed. For example, with QFN, after attaching integrated circuit dies to die pads on a leadframe strip, and wire bonding the dies to the leads of the leadframe strip, blocks (rectangular arrays) of the dies and associated wire bonds are encapsulated in a suitable encapsulant material, for example a plastic mold compound. FIG. 1 is a diagrammatic plan view of four such encapsulated blocks 11 (dies and wire bonds not explicitly shown) encapsulated together with a leadframe strip 13, forming an encapsulated leadframe strip 15. FIG. 2 is a diagrammatic side view of one of the encapsulated blocks 11.

The encapsulated leadframe strip 15 is mounted on a UV curable tape for singulation and strip testing. FIG. 3 shows one of the encapsulated blocks 11 on a UV curable tape 31 in the so-called "dead bug" orientation (also depicted in FIG. 2) with the exposed leads and die pads (not explicitly shown) on top, opposite the tape 31. The tape 31 is somewhat flexible and pliable, and is held in (i.e., stretched over) a "tape frame" (not explicitly shown). With the encapsulated leadframe strip 15 mounted on the UV curable tape 31, a singulating saw (similar to a wafer dicing saw) cuts through the encapsulant and the leadframe strip 13 to singulate the encapsulated dies, thereby forming encapsulated die packages 41 as shown in FIG. 4. After singulation, and as shown diagrammatically in FIGS. 4 and 5, the dies within the singulated die packages 41 are electrically isolated from one another (by the cuts through leadframe strip 13) and ready for strip testing.

FIG. 5 is a diagrammatic plan view of an example with twenty die packages (QFN's) 41 that have been singulated from a 5×4 block of encapsulated dies (e.g., one of the blocks 11 shown in FIG. 1) by a first set of three generally uniformly spaced, parallel saw cuts oriented in a first (north/south or N/S) direction, and a second set of four generally uniformly spaced, parallel saw cuts, oriented in a second (east/west or E/W) direction generally perpendicular to the first direction. The singulated die packages 41 of FIGS. 4 and 5 are held in position for strip test only by their adherence to the UV curable tape 31.

The above-described use of the support tape 31 is somewhat delicate (and relatively costly) to implement. Movement of the encapsulated leadframe strip 15 while supported on the flexible tape 31 during sawing may contribute to generation of copper flakes and burrs that may short leads in the finished package. In addition, the movement can contribute to copper smearing onto the mold compound between leads. In addition, the temperature during strip testing must be suitably limited, because the UV curable tape typically does not withstand temperatures above 85° C. However, strip testing at temperatures above 85° C., and as high as 125° C., is often desirable because it simulates stresses on the die that may be occur during actual operation. After strip testing, the molded packages must be picked off the tape, without leaving any residual adhesive on the packages, and deposited in shipping tubes.

It is desirable in view of the foregoing to provide techniques for IC strip testing that avoid difficulties such as those described above with respect to the prior art.

BRIEF DESCRIPTION OF THE DRAWINGS

FIGS. 6-9 diagrammatically illustrate no-lead IC package strip test techniques according to exemplary embodiments of the present work.

FIG. 10 diagrammatically illustrates an example of a QFN package produced according to techniques shown in FIGS. 6-9.

DETAILED DESCRIPTION

Figure 6:
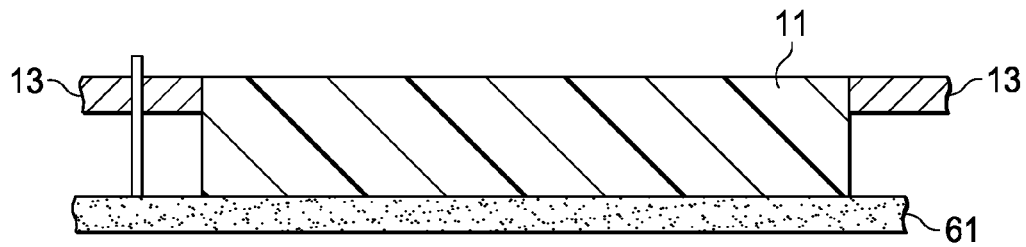

Instead of using a UV curable tape with a tape frame and wafer dicing saw, exemplary embodiments of the present work place the encapsulated leadframe strip 15 on a saw table. FIG. 6 shows an encapsulated block 11 of the encapsulated leadframe strip 15 supported on a saw table 61 while oriented in the dead bug position with exposed die pads and leads (not explicitly shown) on top, opposite the table. The table 61 has one (shown) or more index pins for engagement with one or more holes provided in the leadframe strip 13, to precisely and reproducibly position the encapsulated leadframe strip 15 on the table 61.

Figure 1:
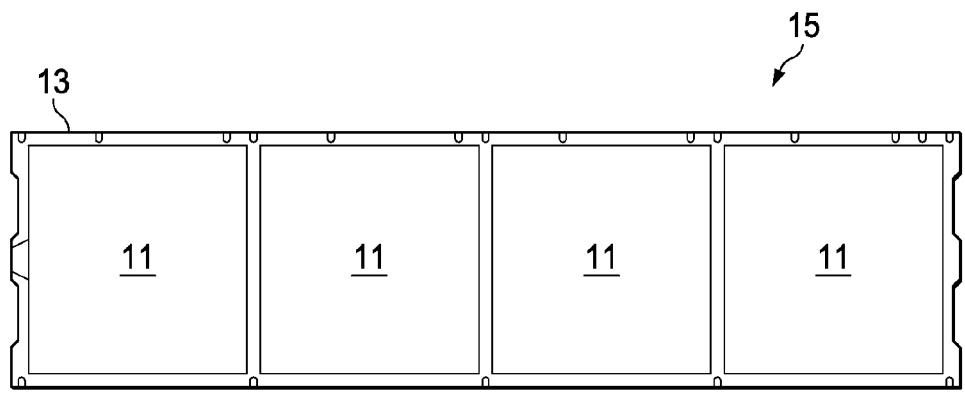
FIGS. 1-5 diagrammatically illustrate no-lead IC package strip test techniques according to the prior art.
Figure 2:
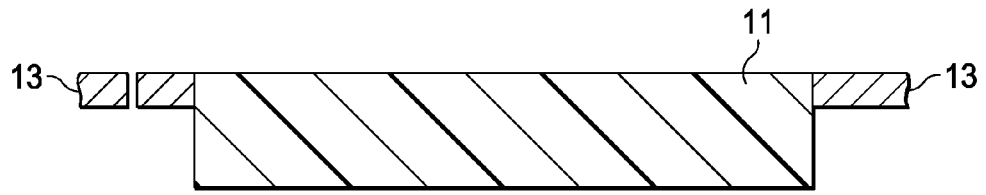
Figure 3:
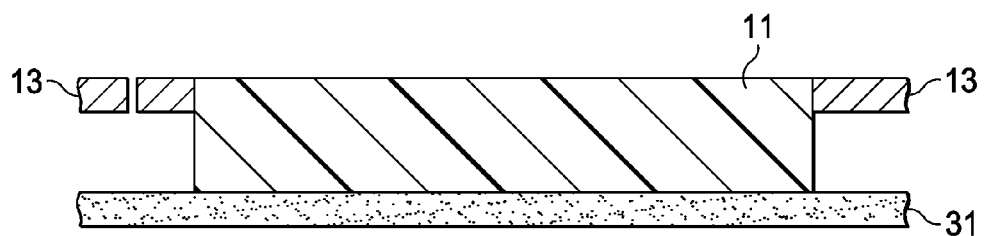
Figure 4:
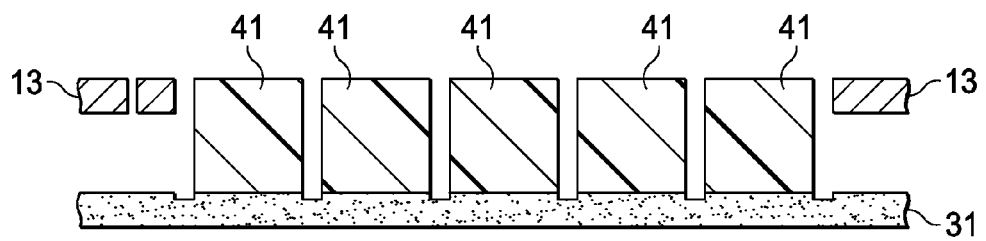
Figure 5:
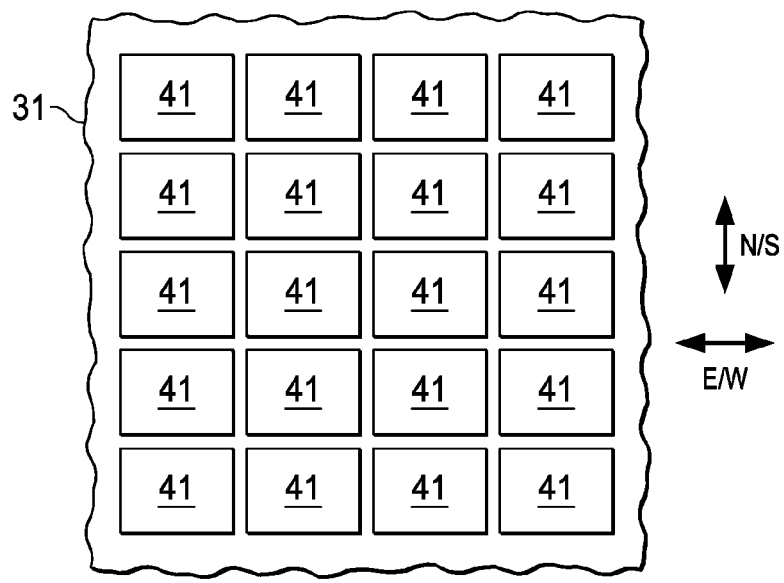
Figure 7:
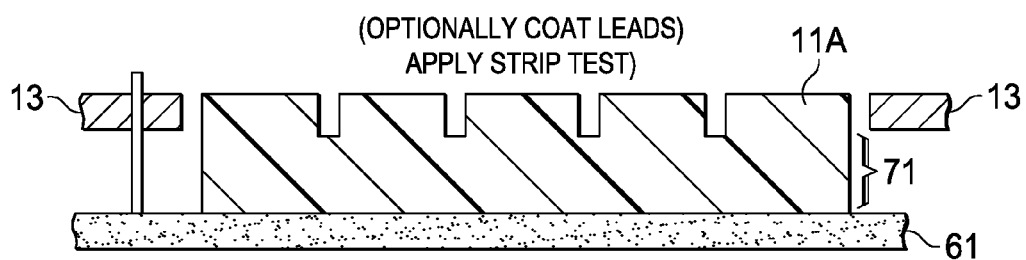

A saw (e.g., a simple table saw in some embodiments) is then used to make initial N/S and E/W cuts at, for example, generally the same locations as the cuts described above with respect to FIGS. 4 and 5. As shown in FIG. 7, however, these initial cuts are only partial cuts that extend toward the table 61 far enough through the encapsulant to sever the metal leads between the encapsulated dies, but do not singulate the encapsulated dies. This produces an encapsulated block structure 11A having the partial cuts formed therein and having a residual, uncut layer of encapsulant 71 between the partial cuts and the saw table 61. The partial cuts electrically isolate the encapsulated dies from one another, and the uncut encapsulant layer 71 holds the isolated dies together in strip form for strip testing. As indicated in FIG. 7, strip testing may now be applied to the encapsulated leadframe strip, which is composed of encapsulated block structures such as shown at 11A. The UV curable tape of the prior art is not needed, so the strip testing may be performed at higher temperatures (up to 175° C.) than in the prior art After strip testing, the encapsulated leadframe strip is placed on a saw table (see, e.g., 82 in FIG. 8), with the partial cuts facing the table (i.e., in the so-called "live bug" orientation with exposed leads and die pads facing the table). An example of this arrangement is shown in FIG. 8. A saw (e.g., a simple table saw in some embodiments) is then used to make further cuts through the residual encapsulant layer 71, from the side of the block structure 11A opposite the partial cuts. These further cuts, also referred to as singulation cuts, are aligned (i.e., N/S and E/W) with the partial cuts and extend to meet the partial cuts, thereby to fully singulate (separate) the encapsulated dies from one another, resulting in a plurality of encapsulated die packages (examples of which are shown at 91 in FIG. 9). The partial cut and the singulation cut will leave a distinct saw mark on the sidewalls of each die package. The two regions of the two distinct saw marks may meet at a step when the two saw blade are of different widths or when the two blades are not perfectly aligned at the two cuts; or when two different sawings are with different methods.

In some embodiments, the table used for the second, singulation sawing operation is formed with a protruding portion that aligns spatially with the pattern of N/S and E/W partial cuts of FIG. 7, and is suitably sized to be received within the partial cuts. In some embodiments, the protruding portion includes a plurality of separate protrusions that respectively align with the partial cuts. In some embodiments, the protruding portion is formed as a single, continuous protrusion that defines a generally rectangular raised grid on the table.

FIG. 8 shows an example of an encapsulated block structure 11A (see also FIG. 7) positioned on a table 82 which has a protruding portion that is received in the partial cuts of the encapsulated block structure 11A. The engagement of the protruding portion with the partial cuts helps ensure precision in aligning the singulation cuts with the partial cuts. The protruding portion effectively defines generally rectangular cavities in which the partially sawn portions of the encapsulated block structure 11A are received. As also shown in FIG. 8, some embodiments provide one (shown) or more index pins for engagement with the leadframe strip 13 to position the encapsulated leadframe strip on the table. FIG. 9 shows examples of encapsulated die packages 91 produced by the aforementioned singulation cuts.

As also shown in FIGS. 8 and 9, some embodiments provide the saw table 82 with vacuum ports 81 at suitable locations laterally offset relative to the protruding portion of the table 82, for example, about midway between the partial N/S and E/W cuts, approximately at the centers of the aforementioned cavities. These vacuum ports 81 engage the partially sawn portions of the encapsulated block structure 11A, and provide suction force to hold the encapsulated die packages 91 in place on the table 82 after the singulation cuts are completed. In some embodiments, the vacuum ports 81 are also used to help stabilize the encapsulated block structure 11A on the table 82 during the singulation sawing.

Various embodiments use various cutting technologies to make the aforementioned singulation cuts through the residual encapsulant layer 71. Examples include a laser, a water jet, or any other suitable cutting technology. Some embodiments make the partial cuts with a saw blade optimized for cutting encapsulant and metal, and make the singulation cuts with a saw blade optimized for cutting encapsulant.

Before performing strip testing, some embodiments treat the partially sawn encapsulated leadframe strip chemically, for electroless plating of NiPdAu, or for applying organic solderability preservative (OSP), to coat the edges of the metal leads that are exposed by the partial cuts or for removing metallic burrs or smears. The coating material is advantageous for corrosion prevention or for solder wetting of the exposed metal. This coating option is indicated in FIG. 7. The strip of partially singulated packages (e.g., the block structure 11A) maintains a consistent orientation of the individual packages in space, which facilitates the chemical processing. The size of the strip facilitates handling during the chemical processing. The chemical processing is consistent because the partially singulated packages are rigidly and consistently spaced. In contrast, fully singulated packages (that have been picked off the tape 31 of FIG. 4) are small and randomly oriented. A reorientation step must typically be performed, which is time consuming and costly. Also, the fully singulated packages are difficult to process through chemical baths because they tend to stick together.

Because the partial cuts and the singulation cuts are made with the encapsulated leadframe strip supported on respective saw tables, the encapsulated leadframe strip remains stabilized during the sawing operations. copper flakes and burrs and copper smearing onto the encapsulant may be avoided because the strip is rigidly stabilized during the sawing operation, for consistent and clean sawing. The stability of the strip during sawing also provides enhanced size uniformity among the die packages 91. Thus, for example, some embodiments produce QFN packages as small as 2×2 mm, or even 1×1 mm, with a high degree of package size uniformity. Some embodiments use the saw table 61 for both sawing operations. Some embodiments use the saw table 82 for both sawing operations.

FIG. 10 is a bottom view of an example of a QFN package 100 produced with techniques described above relative to FIGS. 6-9. The leads are shown at 101 and the die pad at 102. It will be apparent to workers in the art that the techniques described herein are applicable to other types of saw-singulated integrated circuit packages as well, for example, other no-lead packages such as SON packages.

Although exemplary embodiments of the present work have been described above in detail, this does not limit the scope of the work, which can be practiced in a variety of embodiments.

What is claimed is:

1. A method of processing integrated circuit dies, comprising:
providing a plurality of integrated circuit dies mounted on a leadframe strip, electrically connected to the leadframe strip, and encapsulated together with the leadframe strip in an encapsulant;
making first cuts into said encapsulant, wherein said encapsulated integrated circuit dies remain encapsulated together within said encapsulant after completion of said first cuts and said leadframe strip to electrically isolate the encapsulated integrated circuit dies from one another;
performing strip testing on the encapsulated integrated circuit dies without mounting the encapsulated integrated circuit dies on a support tape, including making second cuts through said encapsulant with the encapsulated integrated circuit dies supported on a fixture having a protruding portion that is received in said first cuts while said second cuts are made, wherein said second cuts are aligned with said first cuts and separate the encapsulated integrated circuit dies from one another.

2. The method of claim 1, including using vacuum ports in said fixture to stabilize the encapsulated integrated circuit dies on said fixture.

3. The method of claim 1, wherein the separate, encapsulated integrated circuit dies are Quad Flat No lead (QFN) packages.

4. An encapsulated integrated circuit die, produced according to claim 1.

5. The method of claim 1, including, after said making first cuts and before said performing, providing a coating material on portions of said leadframe exposed by said first cuts.

6. The method of claim 1, including making said first and second cuts respectively in first and second directions that are, relative to said encapsulant, generally opposite one another.

7. The method of claim 1, including using first and second different saws to make said first and second cuts, respectively.

8. A method of processing integrated circuit dies, comprising:

providing a plurality of encapsulated integrated circuit dies that are electrically isolated from one another, and that each have a set of leads connected thereto and accessible externally thereof; and performing strip testing on the encapsulated integrated circuit dies with the encapsulated integrated circuit dies encapsulated together within an encapsulant without mounting the encapsulated integrated circuit dies on a support tape; and making cuts through said encapsulant to separate the encapsulated integrated circuit dies from one another with said encapsulated integrated circuit dies supported on a fixture having a protruding portion received within a portion of said encapsulant.

9. The method of claim 8, including using vacuum ports in said fixture to stabilize the encapsulated integrated circuit dies on said fixture.

10. The method of claim 8, wherein the separate, encapsulated integrated circuit dies are Quad Flat No lead (QFN) packages.

11. An encapsulated integrated circuit die, produced according to claim 8.

12. The method of claim 8, including, before said performing, providing a coating material on the externally accessible sets of leads.

13. The method of claim 8, wherein said making includes using one of a table saw, a laser and a water jet to make said cuts.

* * * * *